(12) United States Patent
Jones, III et al.

(10) Patent No.: US 6,489,914 B1
(45) Date of Patent: Dec. 3, 2002

(54) RSD ANALOG TO DIGITAL CONVERTER

(75) Inventors: Robert S. Jones, III, Austin, TX (US);
Brett J. Thompsen, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/005,275

(22) Filed: Dec. 4, 2001

(51) Int. Cl.[7] .......................... H03M 1/10; H03M 1/34
(52) U.S. Cl. ...................................... 341/162; 341/120
(58) Field of Search .................................. 341/120, 161, 341/162, 163, 172; 708/493, 650, 654, 670

(56) References Cited

U.S. PATENT DOCUMENTS 5,644,308 A  * 7/1997 Kerth et al. ................ 341/120
5,644,313 A    7/1997 Rakers et al.

OTHER PUBLICATIONS

Heubi, Micro Power 'Relative Precision' 13 bits Cyclic RSD A/D Converter, ISLPED 1996 Monterey, CA, pp. 253–257.

* cited by examiner

*Primary Examiner*—Patrick Wamsley
(74) *Attorney, Agent, or Firm*—James L. Clingan, Jr.; Daniel D. Hill

(57) ABSTRACT

A RSD analog to digital converter has an RSD stage that in turn has a switched capacitor integrator (SCI). The SCI uses an operational amplifier. A capacitor, which operates as a offset compensation capacitor, is precharged to the offset voltage of the operational amplifier during a precharge phase. The next phase switches this offset compensation capacitor in the path of the capacitors which are used to perform the integration. The effect is that the offset of the operational amplifier is corrected by the use of the compensation capacitor that had been precharged to the offset voltage during the previous phase.

20 Claims, 4 Drawing Sheets

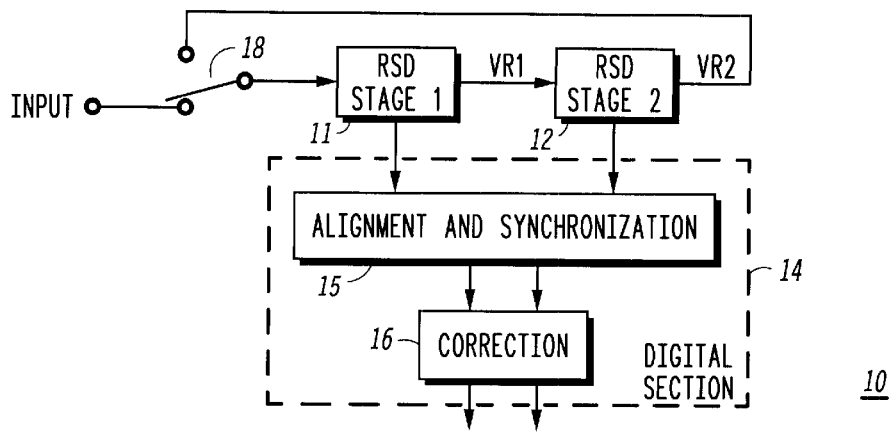
FIG.1
-PRIOR ART-
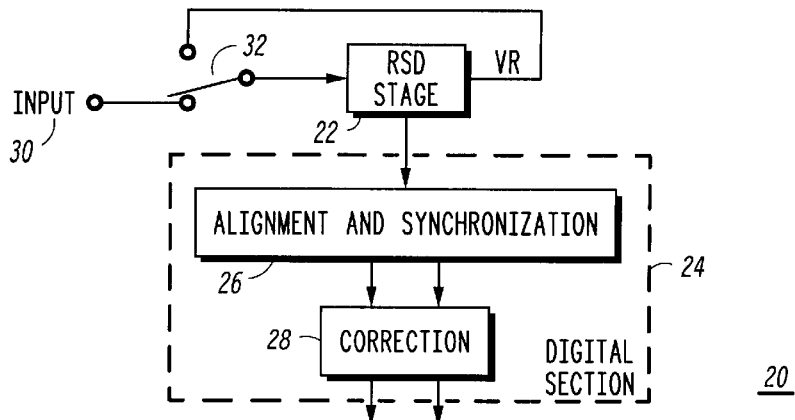
FIG.2
FIG.3
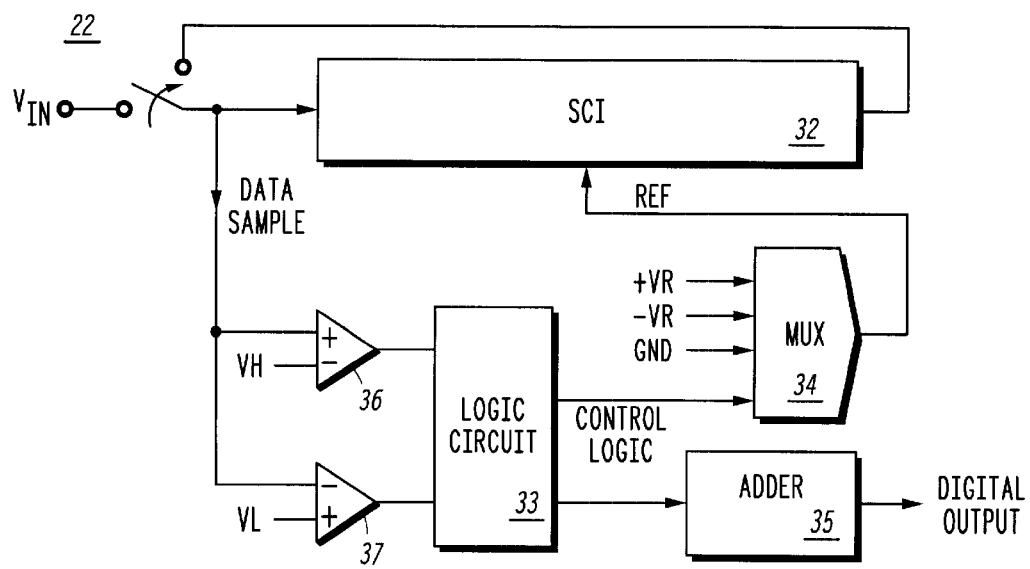

RSD ANALOG TO DIGITAL CONVERTER

REFERENCE TO RELATED CO-PENDING APPLICATIONS

This invention is related to Ser. No. 09/949,245, Garrity et al., filed Sep. 7, 2001, entitled "Low-Power Cyclic A/D Converter," and assigned to the Assignee hereof.

BACKGROUND OF THE INVENTION

1. Field of the Invention

This invention relates to analog to digital (A/D) converters and more particularly to RSD A/D converters.

2. Related Art

RSD (redundant signed digit) A/D converters have been found to be effective for situations in which high speed is useful.

Referring to FIG. 1, a block diagram of a cyclic RSD A/D converter 10, such as the one disclosed in U.S. Pat. No. 5,644,313, is shown. The A/D converter 10 includes an analog section having two RSD stages 11 and 12 followed by a digital section 14 having an alignment and synchronization block 15 and a correction block 16. An analog input signal (voltage) is input to the first RSD stage 11 by way of a switch 18. After the input signal is received, the switch 18 is opened. The first RSD stage 11 compares the input signal to a high voltage (VH) and a low voltage (VL) and generates a first digital output signal, in this case the msb, based on the comparison results. The first RSD stage 11 also generates a first residue voltage VR1. The msb is output to the digital section 14 and the residue voltage VR 1 is input to the second RSD stage 12. The second RSD stage 12 also performs high and low voltage comparison operations, generates a second digital output signal (msb-1), and a second residue voltage VR2. The second digital output signal (msb-1) is output to the digital section 14, the switch 18 is moved to connect the feedback path, and the second residue voltage VR2 is provided to the first RSD stage 11. This operation is repeated, with the RSD stages 11, 12 outputting additional digital bits of the input signal. The digital bits are aligned, synchronized, and combined in the digital section 14 to provide a standard format binary output code.

In some applications, although speed is desired, it is also desirable for there to be high accuracy of the A/D converter. One of the difficulties in providing high precision in a RSD A/D converter is there required a high performance operational amplifier. The operational amplifier should have extremely gain and no offset voltage between the plus and minus inputs thereof. This is very difficult to achieve in practice. The offset voltage is a problem that results in reduced accuracy in the output. This error may be small but may become significant depending upon the application. It can be a limitation in the resolution of the A/D converter. Thus, there is a need for RSD converters with improved resolution.

BRIEF DESCRIPTION OF THE DRAWINGS

Shown in FIG. 1 is a two-stage RSD A/D converter according to the prior art.

FIG. 2 is a block diagram of a prior art RSD A/D converter configuration but having an RSD stage according to the invention.

FIG. 3 is a block diagram of an RSD stage according to the invention.

DETAILED DESCRIPTION OF THE DRAWINGS

Figure 4:
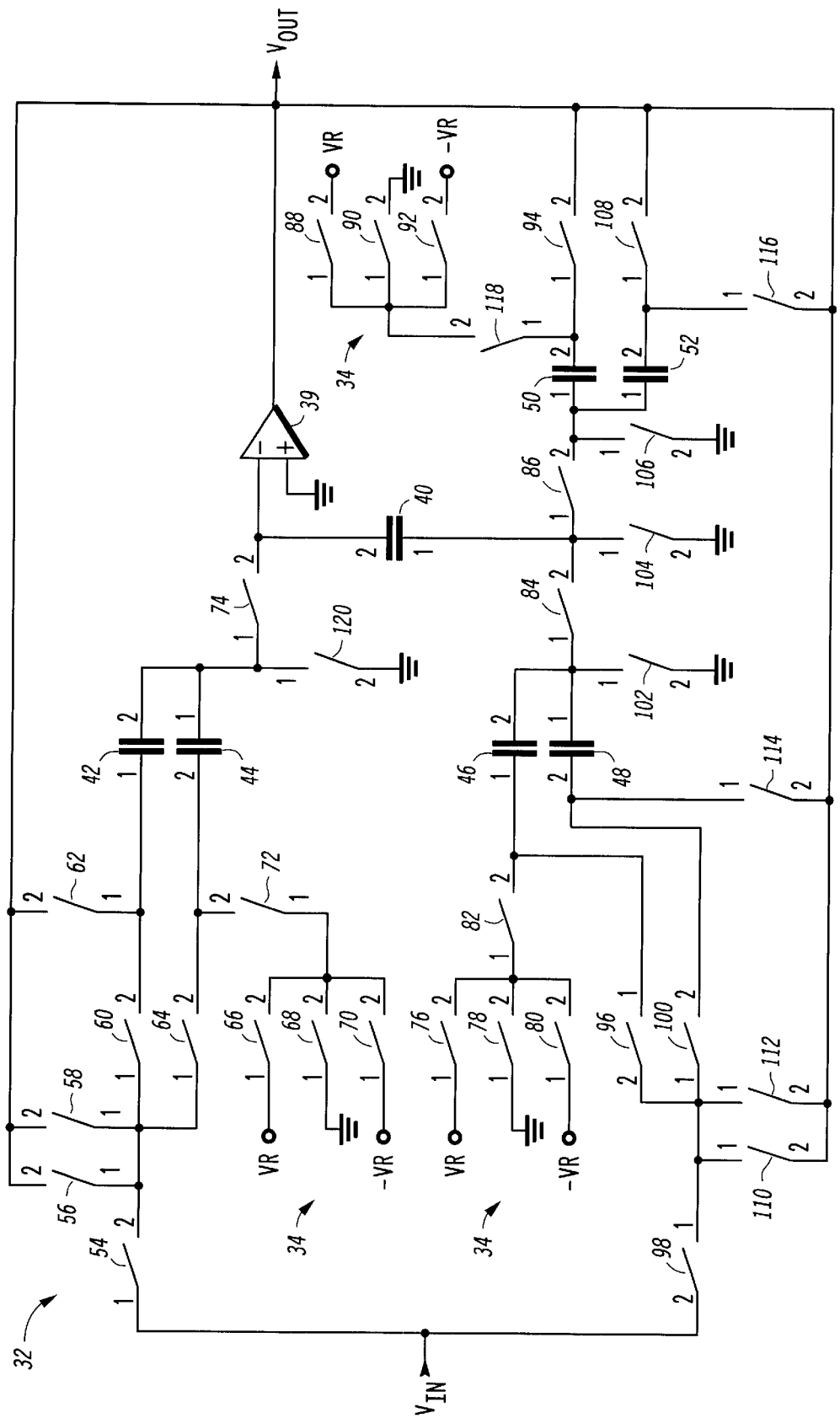
FIG. 4 is a circuit diagram of a switched capacitor integrator according to an embodiment of the invention used in the RSD stage.

A high-speed, high-resolution RSD A/D converter having a switched capacitor integrator (SCI) with an operational amplifier provides compensation for the offset for the operational amplifier. A capacitor stores the amount of the offset and then is used to compensate for that offset when a valid output is to be provided. This is better understood by reference to the drawings and the following description thereof.

Referring now to FIG. 2, a block diagram of a cyclic A/D converter 20 in accordance with the present invention is shown. The A/D converter 20 includes a single RSD stage 22 and a digital section 24. The single RSD stage 22 is capable of maintaining the sample rate and resolution of the prior art two-stage architecture without increasing the speed of the required gain/addition/subtraction circuitry. Only the speed of the comparators is increased. The gain/addition/subtraction functions that previously required two stages are implemented with one stage through the use of an efficient architecture that does not require an increase in speed, thereby resulting in significant area and power savings.

An analog input signal is provided to the RSD stage 22 from an input terminal 30 by way of a first switch 32. The RSD stage 22 provides a digital output signal to the digital section 24. The RSD stage 22 also generates a residual voltage signal VR, which is fed back by way of the first switch 32. The first switch 32 is closed for the first cycle, in which the analog input signal is received, and then opened for the remaining number of cycles that it takes to complete converting the analog signal to a digital signal. Preferably, the feedback loop of the RSD stage 22 is directly connected from the RSD stage 22 output to the first switch 32. As is understood by those of skill in the art, the number of required cycles depends on the number of bits in the digital output signal. For example for a ten bit output signal, ten comparator clock cycles are needed, while only five gain/addition/subtraction circuitry clock cycles (10 clock phases) are needed as was the case with the original two-stage architecture.

The digital section 24, like the digital section 14 of the A/D converter 10 shown in FIG. 1, has an alignment and synchronization block 26 and a correction block 28. The digital bits output from the RSD stage 22 are provided to the digital section 24, where they are aligned, synchronized, and combined to provide a standard format binary output code. As is understood by those of ordinary skill in the art, there are a number of ways to perform the alignment and synchronization.

Shown in FIG. 3 is RSD stage 22 of FIG. 2 shown in more detail. RSD stage 22 comprises a SCI 32 (switched capacitor integrator), a logic block 33, a Vref multiplexer (MUX) 34, an RSD adder 35, a comparator 36, and a comparator 37. SCI 32 provides outputs which are useful in forming the binary signals that form the digital output. SCI 32 is cyclic and continues to produce more and more bits of resolution as the cycles continue. At the very beginning, when a data sample is taken, the input routed to comparators 36 and 37 and to SCI 32. After the sampling has occurred, the input of SCI 32 is coupled to its output and thus the output of SCI 32 is coupled to the comparators 36 and 37. The input to SCI 32 is simplified in FIG. 3 for purposes of clarity. There are actually two inputs for SCI 32 that are alternately coupled to the output after the initial sampling of the data. Signal VH represents a relatively high reference voltage and voltage VL represents relatively low reference voltage. Vref MUX 34 provides one of the high voltage reference Vr, minus the negative reference voltage−Vr, and ground. This is supplied to SCI 32 based upon an output from control logic 33. RSD adder 35 collects the outputs and then formulates them into the proper format to provide the binary output. The logic block reads the comparator inputs and translates that and passes current data information to the RSD adder. This data is clocked so the timing is known to the RSD adder. Simultaneously, the logic block 33 is passing control logic information to Vref MUX 34.

Shown in FIG. 4 is a switched capacitor integrator (SCI) 32 and Vref-MUX 34 comprising an operational amplifier 39, capacitors 40,42, 44, 46, 48, 50, and 52 and switches 54, 56, 58, 60, 62, 64, 66, 68, 70, 72, 74, 76, 78, 80, 82, 84,86,88,90,92,94,96,98,100,102,104,106,108,110,112,114, 116,118, and 120. Switch 54 has a first terminal for receiving an input voltage Vin and a second terminal. Switch 56 has a first terminal connected to the second terminal of switch 54 and a second terminal coupled to an output of operational amplifier 39. Operational amplifier 39 has a minus input, a plus input, and an output. The output of operational amplifier 39 provides an output signal Vout. Switch 58 has a first terminal coupled to the first terminal of switch 56 and a second terminal coupled to the output of operational amplifier 39. Switch 60 has a first terminal connected to the first terminal of switch 58 and a second terminal. Switch 62 has a first terminal connected to the second terminal of switch 60 and a second terminal coupled to the output of operational amplifier 39. Capacitor 42 has a first terminal coupled to the first terminal of switch 62 and a second terminal. Capacitor 54 has a first terminal coupled to the second terminal of capacitor 42 and a second terminal. Switch 64 has a first terminal coupled to the first terminal of switch 60 and a second terminal coupled to the second terminal of capacitor 44. Switch 66 has a first terminal coupled for receiving a reference voltage Vr and a second terminal. Switch 68 has a first terminal coupled to ground and a second terminal coupled to the second terminal of switch 66. Switch 70 has a first terminal coupled for receiving a minus reference voltage−Vr and a second terminal coupled to the second terminal of switch 68. Switch 72 has a first terminal coupled to the second terminal of switch 70 and a first terminal coupled to the second terminal of capacitor 44. Switch 74 has a first terminal coupled to the first terminal of capacitor 44 and a second terminal coupled to the minus input of operational amplifier 39. Switch 76 has a first terminal coupled for receiving the reference voltage Vr and a second terminal. Switch 78 has a first terminal coupled to ground and a second terminal coupled to the second terminal of switch 76. Switch 80 has a first terminal coupled for receiving minus reference voltage−Vr and a second terminal coupled to the second terminal of switch 78. Switch 80 has a first terminal coupled to the second terminal of switch 80 and a second terminal. Capacitor 46 has a first terminal coupled to the second terminal of switch 82 and a second terminal. Capacitor 48 has a first terminal coupled to the second terminal of capacitor 46 and a second terminal. Switch 96 has a first terminal coupled to the second terminal of switch 46 and a second terminal. Switch 100 has a first terminal coupled to the second terminal of switch 96 and a second terminal coupled to the second terminal of capacitor 48. Switch 98 has a first terminal coupled to the first terminal of switch 100 and a second terminal for receiving input voltage Vin. Switch 110 has a first terminal coupled to the first terminal of switch 98 and a second terminal coupled to the output of operational amplifier 39. Switch 112 has a first terminal coupled to the first terminal of switch 98 and a second terminal coupled to the output of operational amplifier 39. Switch 84 has a first terminal coupled to the first terminal of switch 48 and a second terminal. Capacitor 40 has a first terminal coupled to the second terminal of switch 84 and a second terminal coupled to the second terminal of switch 74. The plus input of operational amplifier 39 is coupled to ground. Switch 102 has a first terminal coupled to the first terminal of switch 84 and a second terminal coupled to ground. Switch 104 has a first terminal coupled to the second terminal of switch 84 and a second terminal coupled to ground. Switch 86 has a first terminal coupled to the first-terminal of switch 104 and a second terminal. Switch 106 has a first terminal coupled to the second terminal of switch 86 and a second terminal coupled to ground. Capacitor 50 has a first terminal coupled to the second terminal of switch 86 and a second terminal. Switch 94 has a first terminal coupled to the second terminal of capacitor 50 and a second terminal coupled to the output of operational amplifier 39. Capacitor 52 has a first terminal coupled to the first terminal of capacitor 50 and a second terminal. Switch 108 has a first terminal coupled to the second terminal of capacitor 52 and a second terminal coupled to the output of operational amplifier 39. Switch 118 has a first terminal coupled to the second terminal of capacitor 50 and a second terminal. Switch 88 has a first terminal coupled to the second terminal of switch 118 and a second terminal coupled to the reference voltage Vr. Switch 90 has a first terminal coupled to the first terminal of switch 88 and a second terminal coupled to ground. Switch 92 has a first terminal coupled to the first terminal of switch 90 and a second terminal coupled to the minus reference voltage minus V4. Switch 114 has a first terminal coupled to the second terminal of capacitor 48 and a second terminal coupled to the output of operational amplifier 39. Switch 116 has a first terminal coupled to the second terminal of capacitor 52 and a second terminal coupled to the output of operational amplifier 39. Switch 120 has a first terminal coupled to the first terminal of switch 74 and a second terminal coupled to ground. Switches 66–70, 76–80, and 88–92 comprise Vref MUX 34. These switches from Vref MUX 34 are controlled by control logic 33.

SCI 32 is shown with a singled-ended input for operational amplifier 39 with the minus input coupled to ground, but the circuitry shown may be duplicated to provide a fully differential approach. The fully differential approach has the benefit of improved power supply rejection. The duplicate circuitry would have an output coupled to the minus input of operational amplifier 39. Techniques for converting circuits that are single-ended to fully differential for this purpose of power supply rejection are well known to one of ordinary skill in the art. The single-ended implementation is described in detail herein to simplify understanding of the invention.

Figure 5:
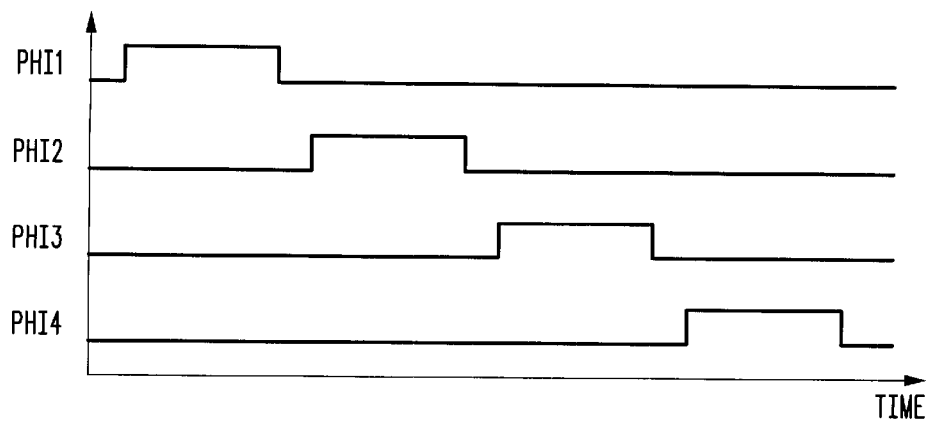
FIG. 5 is a timing diagram for use in understanding the switched capacitor integrator of FIG. 4.

The switches, other than those that are a part of Vref MUX 34, are controlled by four different clock phases. These different phases are shown in FIG. 5. These are shown as phi 1, phi 2, phi 3 and phi 4. A complete cycle is accomplished from the beginning of phi 1 to the end of phi 4. Phi 1 begins at the end of phi 4. Phi 2 begins at the end of phi 1, phi 3 begins at the end of phi 2, and phi 4 begins at the end of phi 3. Each time period is equal to the other. The switches in FIG. 4, other than those of Vref MUX 34, are switched at one or more time periods (phases) phi 1, phi 2, phi 3, and phi 4.

Switch 56 is switched to a closed condition during phi 1 except for the very first phi 1 at the beginning of the first sampling of an input signal, Vin. On the initial phi 1 the data is sampled and subsequent cycles of phi 1 through phi 4 produce 2 bits of resolution per full cycle. For example, if the desired resolution is 10 bits then 5 cycles of phi 1 through phi 4 are required. Switch 58 is closed during phi 3. Switch 62 is closed during phi 2 and phi 4. Switch 60 is closed during phi 1 and phi 3. Switch 64 is closed during phi 1 and phi 3. Switch 74 is closed during phi 2 and phi 4. Switch 72 is closed during phi 2 and phi 4. Switch 120 has a first terminal coupled to a first terminal of switch 74 and a second terminal coupled to ground. Switch 120 is closed during phi 1 and phi 3. Switch 82 is closed during phi 3. Switch 96 is closed during phi 4. Switch 100 is closed during phi 4 and phi 1. Switch 96 is also closed during phi 4 and phi 1. Switch 98 is closed during the first phi 1. Switch 110 is closed during phi 1 except for the first phi 1. Switch 112 is closed during phi 4. Switch 114 is closed during phi 3. Switch 102 is closed during phi 4 and phi 1. Switch 84 is closed during phi 3, switch 104 is closed during phi 2 and phi 4, switch 86 is closed during phi 1, switch 106 is closed during phi 2 and phi 3, switch 116 is closed during phi 1, switch 118 is closed during phi 1, switch 94 is closed during phi 2 and phi 3, switch 108 is closed during phi 2 and phi 3.

During the initial phi 1, switches 56, 60, and 120 are closed as are switches 98, 96, 100, and 102 so that the input is captured-on.capacitors 42, 44, 46, and 48 for the initial phi 1. After the initial phi 1, switches 54 and 98 remain open. Switches 54 and 98 will not become closed again until there is another sample to be captured from Vin and this will be captured on phi 1 and a new series cycles will begin.

Figure 6:
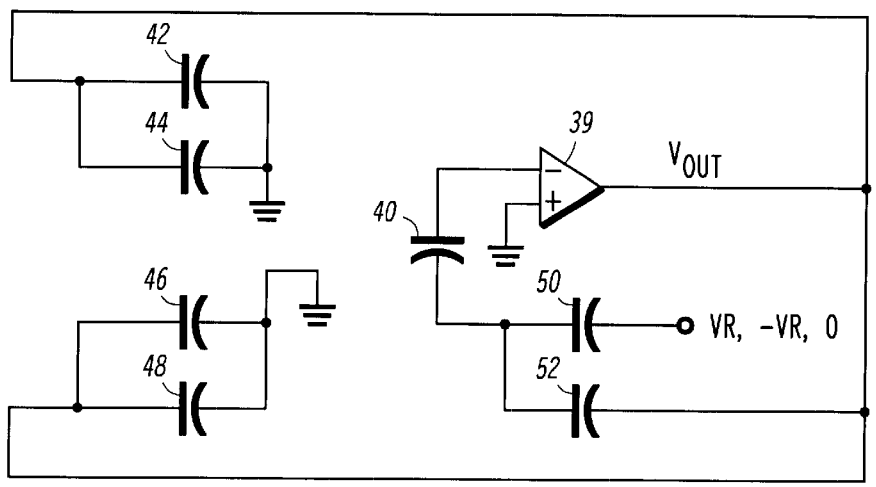
FIG. 6 is an equivalent circuit diagram of switched capacitor integrator of FIG. 4 in a first condition.

FIG. 6 shows the equivalent circuit of SCI 32 for the condition of circuit 32 during the phi 1 phase other than the initial phi 1 phase. This equivalent circuit in FIG. 6 shows how the connections of the various elements of SCI 32 are made by the various switches that are closed during phi 1. Capacitor 40 is coupled between the minus input of operational amplifier 39 and the common node of capacitors 50 and 52. One end of capacitor receives one of Vr, −Vr, and ground (shown as 0 in FIGS. 6–9). This shows that the integration function and output is produced during the initial phi 1. Capacitors have one common node coupled to ground and the other common node coupled to the output of operational amplifier 39. This has the effect of precharging capacitors 42 and 44 in preparation for the next phase, phi 2.

Figure 7:
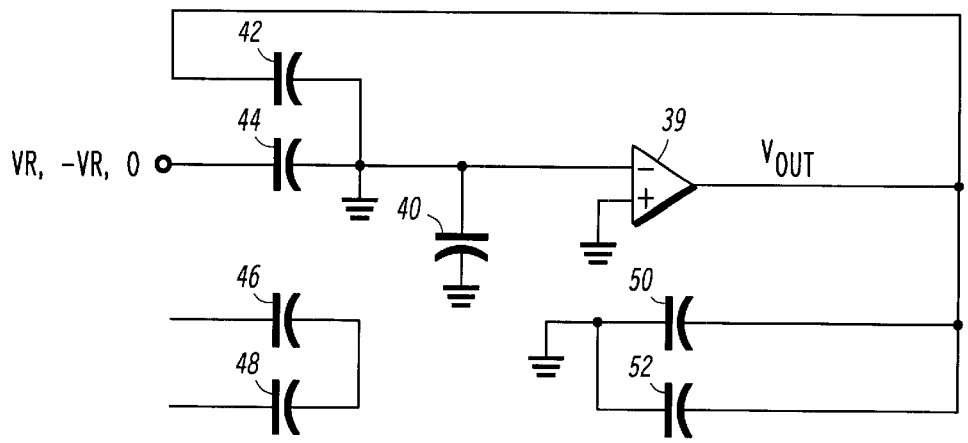
FIG. 7 is an equivalent circuit diagram of the switched capacitor integrator of FIG. 4 in a second condition.

Shown in FIG. 7 is the equivalent circuit of SCI 32 resulting from the switches that close during phi 2. During phi 2, capacitor 40, as shown in FIG. 7, is precharged consistent with the output voltage caused by capacitors 42 and 44. The equivalent circuit in FIG. 7 shows capacitor 42 coupled between the output of operational amplifier 39 and the minus input of operational amplifier 39. Capacitor 44 is coupled between the input of operational amplifier 39 and the selected one of Vr, −Vr, and ground Capacitors 52 and 50 are coupled together with the first terminals thereof coupled to ground and capacitors 46 and 48 left floating. Capacitors 42 and 44 thus simulate a regular function of the SCI so that the offset between the minus input and the plus input for normal operation is present on capacitor 40. Thus, with capacitor 40 being coupled between the plus and minus inputs of operational amplifier 39, capacitor 40 is charged to the offset voltage to allow it to provide offset error correction in the next phase, phi 3.

Figure 8:
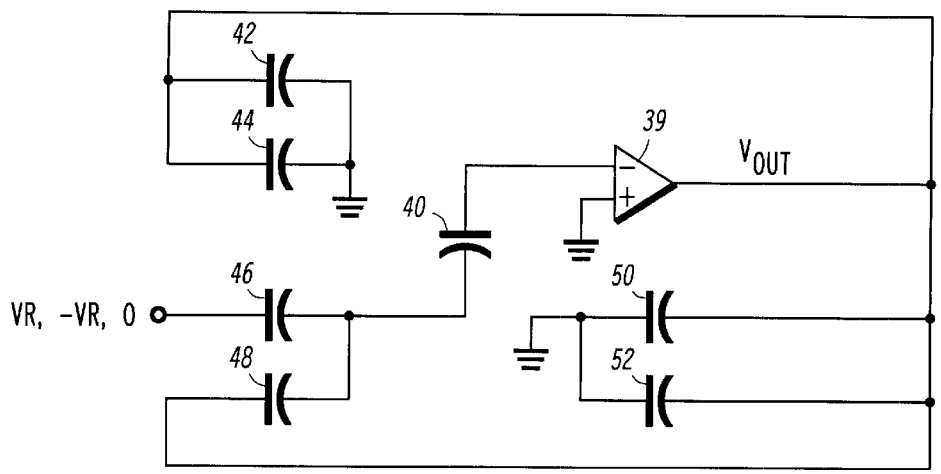
FIG. 8 is an equivalent circuit of the switched capacitor integrator of FIG. 4 in a third condition.

Shown in FIG. 8 is the equivalent circuit of circuit SCI 32 that is formed during phi 3. Capacitors 50 and 52 have one common node coupled to the output of operational amplifier 39 and the other common node coupled to ground. Capacitor 48 has one terminal coupled to the output of operational amplifier 39 and the other terminal coupled to a common node of capacitors 46 and 40. The other terminal of capacitor 40 is coupled to the plus input of operational amplifier 39. The other terminal of capacitor receives one of Vr, −Vr, and ground as determined by control logic 33. Capacitors 42 and 44 have one common node coupled to ground and another common node coupled to the output of operational amplifier 39. In this case capacitors 46 and 48 perform a normal operation of integration but with their common connection coupled to the first terminal of capacitor 40. Thus, the node that would normally be coupled to the minus input of operational amplifier 39 is now offset in voltage by the voltage present on capacitor 40. Capacitor 40 during phi 2 stored the offset voltage of operational amplifier 39. Thus, the common node for capacitors 46 and 48 is offset from the minus input of operational amplifier 39 by the offset voltage. Thus, the common node between capacitors 46 and 48 is compensated by the amount of the offset of operational amplifier 39. The result is the offset voltage of operational amplifier 39 causes minimal, if any, error in the output voltage. During this phase phi 3, an output voltage is provided that corresponds to 1 bit of resolution. Capacitors 42 and 44 are precharged during this operation.

Figure 9:
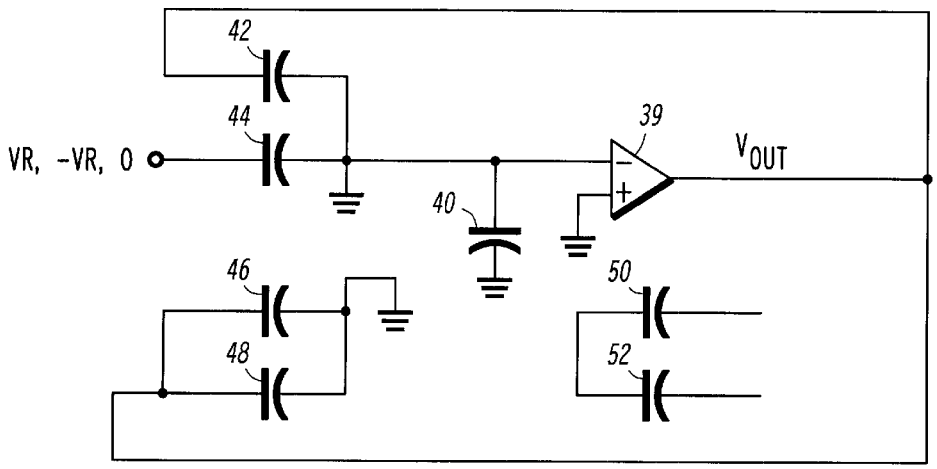
FIG. 9 is an equivalent circuit of the switched capacitor integrator of FIG. 4 in a fourth condition.

Shown in FIG. 9 is the equivalent circuit of SCI circuit 32 during phase phi 4. Capacitors 50 and 52 have one common node that is floating and each have another terminal that is floating. Capacitors 46 and 48 have one common node coupled to ground and another common node coupled to the output of operational amplifier 39. Capacitor 40 has one terminal coupled to the minus input of operational amplifier 39 and the other terminal coupled to ground, which is the same as the plus input connection of operational amplifier 39. Capacitors 42 and 44 have a common node. Capacitor 42 has the other terminal coupled to the output of operational amplifier 39. Capacitor 44 has the other terminal coupled to receive one of Vr, −Vr, and 0 as determined by logic block 33. This shows 42 and 44 performing an integration operation when output Vout is actually provided for the purpose of providing information as to the resolution of the signal., Thus again capacitor 40, because it is coupled between the plus and minus inputs of operational amplifier 39, is charged to a voltage equal to the offset of operational amplifier 39. The amount of offset is matched to normal operation by virtue of the operation of capacitors 42 and 44.

After capacitor 40 has been precharged during phi .4, the next phase is phi 1. FIG. 6 shows the equivalent circuit of SCI circuit 32 during the phi 1 phases except for the very first one. In this first one, the operation of capacitor 50 and 52 result in an output being provided. In this case capacitor 40 also has a voltage equal to the offset voltage of operational amplifier 39 which provides for compensation to capacitors 50 and 52. Thus, the offset of operational amplifier 39 has compensation for the offset by virtue of capacitor 40 and the resolution provided by the circuit is improved because the offset voltage of operational amplifier does not adversely affect the resolution because it is compensated for by capacitor 40. This cycling continues with phase phi 2, which precharges capacitor 40 in preparation for phase phi 3. Phase phi 3 provides data that is followed by phase phi 4, which prepares capacitor 40 to have the offset of operational amplifier 39. Phase phi 1 follows and provides data that has been compensated for by taking care of the offset of operational amplifier 39. Capacitors 42, 44, 46, 48, 50, and 52 and operational amplifier 39 can be viewed as precharge and integration circuitry and capacitor 40 as canceling offset error.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed.

What is claimed is:

1. An analog-to-digital converter, comprising:
   a redundant signed digit (RSD) stage having an input terminal for receiving an analog input signal and having an output terminal for providing a digital output signal, wherein the RSD stage further comprising:
   an operational amplifier having a first input terminal, a reference terminal and an output terminal;
   an input capacitor having a first plate electrode coupled to the first input terminal of the operational amplifier, and a second plate electrode;
   a pair of precharge capacitors switchably coupled between the first input terminal of the operational amplifier and one or more of either the output terminal of the operational amplifier, an input terminal for receiving an analog input signal, and a reference voltage input terminal;
   a first pair of integrating capacitors switchably coupled between the second plate electrode of the input capacitor and one or more of either the output terminal of the operational amplifier, the input terminal for receiving an analog input signal, and the reference voltage input terminal; and
   a second pair of integrating capacitors switchably coupled between the second plate electrode of the input capacitor and one or more of either the output terminal of the operational amplifier, the input terminal for receiving the analog input signal, and the reference voltage input terminal.

2. The analog-to-digital converter of claim 1, wherein each capacitor of the pair of precharge capacitors, each capacitor of the first pair of integrating capacitors, and each capacitor of the second pair of integrating capacitors all have substantially the same capacitance value.

3. The analog-to-digital converter of claim 1, wherein during operation of the analog-to-digital converter, the pair of precharge capacitors and the first and second pairs of integrating capacitors are switchably coupled using four non-overlapping clock signals.

4. The analog-to-digital converter of claim 1, wherein the RSD stage further comprises:
   a first comparator having a first input terminal coupled to the input terminal of the RSD stage for receiving the analog input signal, a second input terminal for receiving a first reference voltage, and an output terminal;
   a second comparator having a first input terminal coupled to the input terminal of the RSD stage for receiving the analog input signal, a second input terminal for receiving a second reference voltage, and an output terminal; and
   an RSD adder having an input coupled to the output terminals of the first and second comparators, and an output for combining bits of the digital output signal to conform to a predetermined binary output code format.

5. The analog-to-digital converter of claim 1 wherein the reference voltage input terminal is for receiving either a positive reference voltage, a negative reference voltage, or zero volts.

6. The analog-to-digital converter of claim 1 wherein the pair of precharge capacitors includes a first capacitor and a second capacitor, the first capacitor having a first plate electrode connected to a first plate electrode of the second capacitor, and a second plate electrode of the first capacitor is coupled to a second plate electrode of the second capacitor in response to a predetermined phase of a four phase non-overlapping clock.

7. The analog-to-digital converter of claim 1 wherein the first pair of integrating capacitors includes a first capacitor and a second capacitor, the first capacitor having a first plate electrode connected to a first plate electrode of the second capacitor, and a second plate electrode of the first capacitor is coupled to a second plate electrode of the second capacitor in response to a predetermined phase of a four phase non-overlapping clock.

8. The analog-to-digital converter of claim 1 wherein the second pair of integrating capacitors includes a first capacitor and a second capacitor, the first capacitor having a first plate electrode connected to a first plate electrode of the second capacitor, and a second plate electrode of the first capacitor is coupled to a second plate electrode of the second capacitor in response to a predetermined phase of a four phase non-overlapping clock.

9. The analog-to-digital converter of claim 1 wherein during a first predetermined clock phase of a four phase non-overlapping clock, the second pair of integrating capacitors and the input capacitor are coupled to the operational amplifier to perform an integration function.

10. The analog-to-digital converter of claim 1 wherein the pair of precharge capacitors includes a first capacitor and a second capacitor, the first pair of integrating capacitors includes a third capacitor and a fourth capacitor, and the second pair of integrating capacitors includes a fifth capacitor and a sixth capacitor, and during a predetermined clock phase of a four phase non-overlapping clock, the RSD stage being coupled as follows:
   the first capacitor having a first plate electrode coupled to a ground terminal, and a second plate electrode coupled to the output terminal of the operational amplifier;
   the second capacitor having a first plate electrode coupled to the ground terminal, and a second plate electrode coupled the output terminal of the operational amplifier;
   the third capacitor having a first plate electrode coupled to the ground terminal, and a second plate electrode coupled to the output terminal of the operational amplifier;
   the fourth capacitor having a first plate electrode coupled to the ground terminal, and a second plate electrode coupled to the output terminal of the operational amplifier;
   the fifth capacitor having a first plate electrode coupled to the second plate electrode of the input capacitor, and a second plate, electrode coupled to the reference voltage input terminal; and the sixth capacitor having a first plate electrode coupled to the second plate electrode of the input capacitor, and a second plate electrode coupled the output terminal of the operational amplifier.

11. The analog-to-digital converter of claim 1 wherein the pair of precharge capacitors includes a first capacitor and a second capacitor, the first pair of integrating capacitors includes a third capacitor and a fourth capacitor, and during a predetermined clock phase of a four phase non-overlapping clock, the RSD stage being coupled as follows:

the first capacitor having a first plate electrode coupled to the input terminal of the operational amplifier, and a second plate electrode coupled to the output terminal of the operational amplifier;

the second capacitor having a first plate electrode coupled to the input terminal of the operational amplifier, and a second plate, electrode coupled to the reference voltage input terminal;

the third capacitor having a first plate electrode coupled to the ground terminal, and a second plate electrode coupled to the output terminal of the operational amplifier;

the fourth capacitor having a first plate electrode coupled to the ground terminal, and a second plate electrode coupled to the output terminal of the operational amplifier; and the second plate electrode of the input capacitor coupled the ground terminal.

12. A redundant signed digit (RSD) analog-to-digital converter, comprising:

an RSD stage having an input terminal for receiving an analog input signal and having an output terminal for providing a digital output signal, wherein the RSD stage further comprising:

an operational amplifier having a first input terminal, a reference terminal and an output terminal;

an input capacitor having a first plate electrode coupled to the first input terminal of the operational amplifier, and a second plate electrode; and a precharge and integration circuit coupled to the first and second plate electrodes of the input capacitor, wherein in response to receiving a clock signal, the input capacitor for canceling an offset error of the RSD stage.

13. The RSD analog-to-digital converter of claim 12, wherein the precharge and integration circuit comprises:

a pair of precharge capacitors switchably coupled between the first input terminal of the operational amplifier and one or more of either the output terminal of the operational amplifier, an input terminal for receiving an analog input signal, and a reference voltage input terminal;

a first pair of integrating capacitors switchably coupled between the second plate electrode of the input capacitor and one or more of either the output terminal of the operational amplifier, the input terminal for receiving an analog input signal, and the reference voltage input terminal; and a second pair of integrating capacitors switchably coupled between the second plate electrode of the input capacitor and one or more of either the output terminal of the operational amplifier, the input terminal for receiving the analog input signal, and the reference voltage input terminal.

14. The RSD analog-to-digital converter of claim 13, wherein each capacitor of the pair of precharge capacitors, each capacitor of the first pair of integrating capacitors, and each capacitor of the second pair of integrating capacitors all have substantially equal capacitance values.

15. The RSD analog-to-digital converter of claim 14, wherein during operation of the RSD analog-to-digital converter, the pair of precharge capacitors and the first and second pairs of integrating capacitors are switchably coupled using four non-overlapping clock signals.

16. The RSD analog-to-digital converter of claim 14, wherein the RSD stage further comprises:

a first comparator having a first input terminal coupled to the input terminal of the RSD stage for receiving the analog input signal, a second input terminal for receiving a first reference voltage, and an output terminal;

a second comparator having a first input terminal coupled to the input terminal of the RSD stage for receiving the analog input signal, a second input terminal for receiving a second reference voltage, and an output terminal; and an RSD adder having an input coupled to the output terminals of the first and second comparators, and an output for combining bits of the digital output signal to conform to a predetermined binary output code format.

17. The RSD analog-to-digital converter of claim 14, further comprising a reference voltage circuit having a first input for receiving a positive reference voltage, a second input for receiving a negative reference voltage, and third input for receiving zero volts, the reference voltage circuit having an output terminal for providing one of the positive reference voltage, the negative reference voltage or zero volts to the reference voltage input terminals of the pair of precharge capacitors and the first and second integrating capacitors based on a first output voltage provided by the first comparator and on a second output voltage provided by the second comparator.

18. A redundant signed digit (RSD) analog-to-digital converter, comprising:

an RSD stage having an input terminal for receiving an analog input signal and having an output terminal for providing a digital output signal, wherein the RSD stage further comprises:

an operational amplifier having a first input terminal, a reference terminal and an output terminal;

an input capacitor having a first plate electrode coupled to the first input terminal of the operational amplifier, and a second plate electrode; and a precharge and integration circuit coupled to the first and second plate electrodes of the input capacitor, wherein in response to receiving a clock signal, the input capacitor for canceling an offset error of the RSD stage;

a first comparator having a first input terminal coupled to the input terminal of the RSD stage for receiving the analog input signal, a second input terminal for receiving a first reference voltage, and an output terminal;

a second comparator having a first input terminal coupled to the input terminal of the RSD for receiving the analog input signal, a second input terminal for receiving a second reference voltage, and an output terminal; and an RSD adder having an input coupled to the output terminals of the first and second comparators, and an output for combining bits of the digital output signal to conform to a predetermined binary output code format.

19. The RSD analog-to-digital converter of claim 18, wherein the precharge and integration circuit comprises:
- a pair of precharge capacitors switchably coupled between the first input terminal of the operational amplifier and one or more of either the output terminal of the operational amplifier, an input terminal for receiving an analog input signal, and a reference voltage input terminal;
- a first pair of integrating capacitors switchably coupled between the second plate electrode of the input capacitor and one or more of either the output terminal of the operational amplifier, the input terminal for receiving an analog input signal, and the reference voltage input terminal; and
- a second pair of integrating capacitors switchably coupled between the second plate electrode of the input capacitor and one or more of either the output terminal of the operational amplifier, the input terminal for receiving the analog input signal, and the reference voltage input terminal.

20. The RSD analog-to-digital converter of claim 19, wherein each capacitor of the pair of precharge capacitors, each capacitor of the first pair of integrating capacitors, and each capacitor of the second pair of integrating capacitors all have substantially equal capacitance values.

* * * * *

UNITED STATES PATENT AND TRADEMARK OFFICE
CERTIFICATE OF CORRECTION

PATENT NO.    : 6,489,914 B1
DATED         : December 3, 2002
INVENTOR(S)   : Robert S. Jones et al.

It is certified that error appears in the above-identified patent and that said Letters Patent is hereby corrected as shown below:

Column 7,
Line 27, change "comprising" to -- comprises --.

Column 9,
Line 5, insert -- to -- after "coupled".
Line 31, insert -- to -- before "the".
Line 37, change "comprising" to -- comprises --.

Signed and Sealed this

Seventeenth Day of June, 2003

JAMES E. ROGAN
*Director of the United States Patent and Trademark Office*